(12) United States Patent
Venkatachary et al.

(10) Patent No.: US 7,451,267 B1
(45) Date of Patent: Nov. 11, 2008

(54) METHOD AND APPARATUS FOR LEARN AND RELATED OPERATIONS IN NETWORK SEARCH ENGINE

(75) Inventors: Srinivasan Venkatachary, Sunnyvale, CA (US); Ajay Srikrishna, Fremont, CA (US); Jagadeesan Rajamanickam, San Jose, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 460 days.

(21) Appl. No.: 10/948,050

(22) Filed: Sep. 22, 2004

Related U.S. Application Data

(60) Provisional application No. 60/505,382, filed on Sep. 23, 2003.

(51) Int. Cl.
*G06F 12/00* (2006.01)
(52) U.S. Cl. ........................... 711/108; 711/103
(58) Field of Classification Search .................. 711/108
See application file for complete search history.

(56) References Cited

U.S. PATENT DOCUMENTS

| | | | |
|---|---|---|---|
| 5,343,559 A | 8/1994 | Lee | |
| 5,367,658 A * | 11/1994 | Spear et al. | 711/163 |
| 5,802,568 A * | 9/1998 | Csoppenszky | 711/136 |
| 5,920,886 A | 7/1999 | Feldmeier | 711/108 |
| 6,240,485 B1 | 5/2001 | Srinivasan et al. | |
| 6,219,748 B1 | 8/2001 | Srinivasan et al. | |
| 6,381,673 B1 | 4/2002 | Srinivasan et al. | |
| 6,393,514 B1 * | 5/2002 | Khanna et al. | 711/108 |
| 6,502,163 B1 | 12/2002 | Ramankutty | |
| 6,542,391 B2 * | 4/2003 | Pereira et al. | 365/49 |
| 6,591,331 B1 * | 7/2003 | Khanna | 711/108 |
| 6,606,040 B2 | 8/2003 | Abdat | 341/87 |
| 6,647,457 B1 | 11/2003 | Sywyk et al. | |
| 6,697,276 B1 | 2/2004 | Pereira et al. | 365/49 |
| 6,757,779 B1 | 6/2004 | Nataraj et al. | |
| 6,772,279 B1 | 8/2004 | Sun et al. | |
| 6,809,944 B2 * | 10/2004 | Regev et al. | 365/49 |
| 6,934,795 B2 * | 8/2005 | Nataraj et al. | 711/108 |
| 7,120,731 B1 | 10/2006 | Bhugra et al. | 711/108 |
| 7,155,565 B2 * | 12/2006 | Regev | 711/108 |
| 2003/0169612 A1 * | 9/2003 | Hu | 365/49 |
| 2004/0022082 A1 | 2/2004 | Khannu | 365/49 |
| 2004/0128438 A1 * | 7/2004 | Regev et al. | 711/108 |

OTHER PUBLICATIONS

U.S. Appl. No. 10/271,660, James et al.
U.S. Appl. No. 10/202,526, Zou et al.
U.S. Appl. No. 10/197,298, Sun et al.

* cited by examiner

*Primary Examiner*—Reginald G. Bragdon
*Assistant Examiner*—Aracelis Ruiz
(74) *Attorney, Agent, or Firm*—Haverstock & Owens, LLP

(57) ABSTRACT

A search engine method and apparatus can store and update status information for each entry of a content addressable memory (CAM) array, for a learn operation, or the like. A search engine can include a status memory block external to and independent of the CAM array. A status memory block (800) can include a number of memory sections (806-0 to 806-2) that each includes a number of bit locations for storing a free/not-free status of CAM entries in a hierarchical fashion. Corresponding control sections (808-0 to 808-2) can include priority encoders (812-0 to 812-2) that determine a first free element in a memory section for a next hierarchical level, as well as status aggregation logic (814-0 to 814-2) that can generate an aggregated status that is propagated to a previous hierarchical level.

20 Claims, 10 Drawing Sheets

US 7,451,267 B1

METHOD AND APPARATUS FOR LEARN AND RELATED OPERATIONS IN NETWORK SEARCH ENGINE

This application claims the benefit of U.S. provisional patent application Ser. No. 60/505,382 Filed on Sep. 23, 2003.

TECHNICAL FIELD

The present invention relates generally to electronic circuits and in particular memory circuits used in network search engines like those that include content addressable memory (CAM) devices.

BACKGROUND OF THE INVENTION

Network search engines (NSEs), which can include content addressable memory (CAM) devices such as ternary CAM (TCAM) devices, can be used in many applications related to data networks. As but one example, NSEs can be used to search databases such as Access Control Lists (ACLs). An ACL can present a set of rules that can limit access to a network (e.g., forwarding of packets) to only those packets having fields falling within a particular range.

The relatively rapid speed at which CAM devices can compare multiple entries to an applied search key value has resulted in CAMs enjoying widespread use in NSE devices.

A typical CAM device can include a large number of entries, each of a designated width. As but one example, a 20-megabit CAM device can have 256K entries, each having a width of 80-bits. CAM devices may include both binary CAM devices and ternary CAM (TCAM) devices. Binary CAM devices typically generate a match indication when all bits of a search key match all the bits of an entry. TCAM devices typically include entries having data bits that can be masked from a compare operation. Thus, a corresponding search key bit value can be said to match a corresponding entry bit when the two are the same, or when the entry bit is masked.

CAM devices can support a variety of NSE device functions, including "read" operations, "write" operations, and "search" operations. In a read operation, CAM entry value (data and/or mask value) can be output according to an applied read address. In write operation, a data value (and/or mask value) can be input in conjunction with a write address to store the data value at a CAM entry location. In a search operation, a search key can be applied to all CAM entries, and a highest priority CAM entry matching the search key can register a match (HIT) otherwise a MISS is registered. The result of a HIT is typically an index value, which can be the address of the matching CAM entry or some value generated therefrom. Priority of HIT results is typically determined according to CAM entry address. For example, in the event multiple CAM entries match a given search key, the CAM entry having the lowest address is given the highest priority, typically by operation of a priority encoder.

Another desirable operation of an NSE device can be a "learn" operation. In a learn operation, an input data value can be written to a next "free" CAM entry location. Such an operation can also include outputting the address of the CAM entry location. A free CAM entry is a CAM entry that does not currently store valid data, and hence is available for storing a valid data value. A next free CAM entry is the highest priority CAM entry that is free. Conversely, a "not-free" CAM entry is a CAM entry that is not available for storing a new data value.

The address corresponding to a next free CAM entry is referred to as a next free address (NFA).

The inclusion of a learn operation capability in an NSE device can be highly desirable, as it can eliminate the need for other system resources to keep track of which entries are free and which entries are not, and/or which of the free entries has a highest priority.

In one conventional arrangement for performing a learn operation, one or more bits in every CAM entry can indicate if the CAM entry is free or not-free (called the "entry-free" bit). When a learn operation is performed, a CAM entry is written to, and the corresponding entry-free bit is marked not-free. A search-next-free operation is then performed on the "entry-free" bits of each CAM entry to locate a next free entry.

To better understand various aspects of the present invention, a conventional approach to executing a learn operation with a CAM device will now be described with reference to FIG. 12.

A conventional CAM device 1200 can include a number of "superblocks", one of which is shown as 1202. Each superblock 1202 can include a number of sub-blocks 1204, each of which can include a number of CAM rows 1206-0 to 1206-511. Learn operations are facilitated by sub-blocks 1204 that include CAM rows (1206-0 to 1206-511) that provide a match indication (M0 to M511) as well as a status indication (C0 to C511), or entry-free bit. Further, multiplexers (MUXs) 1208-0 to 1208-511 are provided to each row.

In a search operation, MUXs (1208-0 to 1208-511) can provide match indications to a priority encoder 1210 to thereby prioritize and encode a highest match result.

However, in a learn operation, MUXs (1208-0 to 1208-511) can provide status indications (C0 to C511) to a priority encoder 1210. Status indications can be the inverse of a valid bit for an entry. Thus, priority encoder will prioritize and encode a highest "invalid" (or free) entry. A data value can then be written to the address of such an entry.

In the very particular arrangement of FIG. 12, in a learn operation, learn results from each sub-block 1204 can be stored in a corresponding sub-block next free address (NFA) register 1212-0 to 1212-$m$. A value in one of the sub-block NFA registers (1212-0 to 1212-$m$) can be selected by a magnitude comparator 1214-$n$. Such a selected value can be stored in a super-block NFA register (1216-0 to 1216-$p$). A value in one of the super-block NFA registers (1216-0 to 1216-$p$) can be selected by a global priority encoder 1218. Such a value can then be stored in a global NFA register 1220.

A conventional CAM device 1200 can further include a write address MUX 1222. A write address MUX can have one input that receives an address from global NFA register 1220 and another input that receives an external write address. In a learn operation, the address value in global NFA register 1220 can be output by write address MUX 1222. In a "normal" write operation (not a learn operation), an externally applied write address can be output by write address MUX 1222.

Various aspects of such an arrangement are further detailed in U.S. Pat. No. 6,647,457 issued to Sywyk et al. on Nov. 11, 2003.

Other conventional approaches to providing CAM entry status information have included incorporating "shadow" registers to maintain a record of which entries are valid.

Conventional solutions like those described above can have some disadvantages. In many next generation applications, a higher throughput of operations (such as learns) is expected at the cost of higher latency. For example, a conventional approach can provide a throughput of 8 million learn operations per second with a latency of 3 to 4 cycles. However, future applications may require a throughput of 30 to 50 million learn operations per second with a latency of 20-40 cycles. Thus, a throughput of 30-50 million learns per second is desirable, even at the cost of higher search latencies.

In addition, some conventional solutions for providing a learn operation require that a "search-miss" event occur before the learn operation is performed. That is, only after a search key has been applied and none of the CAM entries match, can the learn operation be performed. Further, in such an arrangement, the write data for the learn operation is typically limited to the search key data. Such approaches are suitable for earlier generation CAM applications, such as those in which media access control (MAC) learning was a primary application. However, in future applications, such as reflexive ACLs (which can dynamically update entry values in response to particular incoming/outgoing data packet values), operations do not follow the search-miss then learn pattern. In particular, a learn operation can occur after a search hit result.

In light of the above, it would be desirable to arrive at some way of providing learn operations at a very high throughput rate, without necessarily providing very low latency values.

It would also be desirable to provide a search engine devices and methods that do not require a search-miss event before a learn operation can be performed.

It would also be desirable to provide a search engine device that can provide any of the above features, yet not unduly increase overall area needed for such a device.

It would also be desirable to provide search engine device that can provide any of the above features, yet remain relatively easy to implement and verify.

SUMMARY OF THE INVENTION

The present invention can include a search engine device having a content addressable memory (CAM) cell array arranged into a plurality of CAM entries that each store data values for comparison with search key values. A status memory block can be included that is separate from the CAM cell array and that includes a plurality of higher level status bits that each correspond to multiple CAM entries. Each higher level status bit can indicate whether one of the multiple CAM entries is free for a learn operation or all of the multiple CAM entries are not-free for a learn operation.

Such an arrangement can allow for more compact storage than arrangements that dedicate a CAM cell for the storage of status data. Further, separation of a status memory block from a corresponding CAM cell array can result in easier design and verification of a search engine that includes both such sections.

According to one aspect of the embodiments, a status memory block can include static random access memory (SRAM) cells.

Such an arrangement can allow for compact storage of status data as compared to conventional approaches utilizing an entry-free CAM cell, as SRAM cells are typically smaller than CAM cells.

According to another aspect of the embodiments, a status memory block can include at least a leaf section having a plurality of rows that each include a plurality of bits, each such bit representing the free/not-free status of one CAM entry, and at least one priority encoder for receiving and encoding a highest priority bit from a selected row of the leaf section into an index value.

In such an arrangement, a highest priority free entry can be rapidly determined by operation of a priority encoder.

According to another aspect of the embodiments, a status memory block can include a next free address (NFA) register that stores the address of a highest priority CAM entry having a free status. In addition, at least a portion of the address of the highest priority CAM entry can be generated by at least one priority encoder.

By utilizing an NFA register that stores an up to date NFA value, learn operations can be executed without having to first execute a search-miss type operation.

According to another aspect of the embodiments, a search engine device can also include an input control section and an address multiplexer. An address multiplexer can have a first input coupled to the status memory block for receiving a next free address value, a second input coupled to the input control section that can receive a write address value, and an output coupled to the CAM cell array.

In such an arrangement, a NFA value can be rapidly provided to a CAM cell array, and again, without the need for a search-miss operation.

According to another aspect of the embodiments, a status memory block can include a leaf section having $x*y*z$ bits, each of which stores a free/not-free status of a CAM entry, an initial search section of x bits, each such bit representing a write status for a different set of $y*z$ CAM entries, and a priority encoder for encoding a highest priority bit from the x bits.

In addition, a priority encoder can encode a highest priority bit from the y bits and from the z bits.

Such an arrangement can result in a hierarchical arrangement of status data, with an initial section having bit values representing blocks of CAM entries. This can allow rapid generation of an NFA address and the designation of "learn" sections (the designation of blocks of CAM entries as available or not available for a learn operation).

According to another aspect of the embodiments, a status memory block can include a leaf section having a plurality of rows, each of which includes a plurality of leaf bits, each bit of the leaf section representing a free/not-free status of a corresponding CAM entry. In addition, an intermediate section can be included that has a plurality of rows, each of which includes a plurality of intermediate bits, each such intermediate bit corresponding to each row of the leaf section. Each bit of the intermediate section can indicate whether all of the CAM entries of the corresponding leaf section row have a not-free status or if any of the CAM entries of the corresponding leaf section row has a free status. A priority encoder can receive and encode a highest priority bit from a selected row of the intermediate section.

In this way, a highest priority free CAM entry can be determined by priority encoding bits from different hierarchical levels of the status memory.

According to another aspect of the embodiments, a status memory block can include a leaf section having $x*y*z$ bit storage locations, each of which indicates the free/not-free status of a CAM row, an intermediate section having $x*y$ bit storage locations, each corresponding to a different z bits of the leaf section and indicating if any one of the corresponding z bits has a free status, and a initial search section having x bit storage locations, each corresponding to a different $y*z$ bits of the leaf section and indicating if any one of the corresponding $y*z$ bits has a free status.

In such a hierarchical arrangement, "learn" blocks can be established at any of a number of levels.

According to another aspect of the embodiments, given the above arrangement of status bits, a next free address (NFA) register can store the address of a highest priority CAM entry available for a write operation, where such an address is a combination of binary values i, j and k, where i is an encoded value in the range of 0 to x−1, j is an encoded value in the range of 0 to y−1, and k is an encoded value from 0 to z−1.

In this way, an NFA value can be generated relatively rapidly by multiple priority encoding operations.

The present invention can also include an apparatus having a content addressable memory (CAM) device for performing a learn operation. The apparatus can include a status memory circuit block external to and independent from any CAM array of the apparatus. A status memory circuit block can include a plurality of sub-blocks. Each sub-block can include a plurality of memory elements storing free/not-free status for at least one entry of the CAM array. In addition, each sub-block can include at least one priority encoder for determining a highest priority bit from a plurality of bits provided by memory elements of at least one of the sub-blocks.

Such an arrangement can encode memory elements separate from a CAM array to determine a next free address (NFA). This can allow for a more compact overall search engine device and/or a device that may be easier to design or verify.

According to one aspect of the embodiments, the sub-blocks have a hierarchy with respect to one another. A lowest sub-block of the hierarchy has memory elements that each store the free/not-free status of one entry of the CAM array. In addition, memory elements of each sub-block store the free/not-free status of a larger number of entries of the CAM array than the memory elements of sub-blocks that are lower in the hierarchy.

According to one aspect of the embodiments, each sub-block except the lowest hierarchy sub-block includes memory elements that each store the status of an aggregation of memory element values of the next lower sub-block in the hierarchy. Each sub-block also includes status aggregation logic that generates an aggregated status value from memory element values of the next lower sub-block in the hierarchy.

According to one aspect of the embodiments, each sub-block includes a corresponding priority encoder for determining the location of a highest priority bit from a plurality of bits provided by memory elements of the corresponding sub-block.

The present invention may also include a method for tracking a free/not-free status of entries in search engine device, where such entries are compared to a search key. The method can include the steps of: storing free/not-free status data for each entry in a status memory that is a physically separate circuit block from the entries; storing a free/not-free status of each entry as one bit in a lowest hierarchy level; and storing aggregation bits in at least one higher hierarchy level, each aggregation bit representing the free/not-free status for different groups of bits in lowest hierarchy level. The method can also include determining at least a portion of next free address by prioritizing and encoding selected bits from the lowest hierarchy level and prioritizing and encoding selected bits from the at least one higher hierarchy level.

According to another aspect of the embodiments, in a find next free address operation, the method can include prioritizing aggregation bits of one higher hierarchy level to determine a group of bits in the lowest hierarchy level that includes at least one bit having a free status and encoding a storage location including such an aggregation bit to form a first part of a next free address. The find next free address operation can also include prioritizing the group of bits in the lowest hierarchy level to determine a bit corresponding to a highest priority entry having a free status and encoding a storage location for such a bit to form a second part of the next free address. A next free address can be stored in a next free address register.

According to another aspect of the embodiments, each entry of the search engine can have a unique address and each bit of the lowest hierarchy level corresponds to one such unique address. In a learn operation, the method includes: writing learn data to an entry corresponding to a learn address; updating the status of the bit in the lowest hierarchy level corresponding to the learn address from free to not-free; and updating the status of all aggregation bits corresponding to the updated bit in the lowest hierarchy level. The learn operation can further include performing a find next free address operation.

In this way, a valid next free address will always be generated following each learn operation. Thus, learn operations need not rely on an initial search-miss operation to find a next free address.

According to another aspect of the embodiments, a method can include, in an initialization operation, setting all bits in all hierarchy levels to a free status, and performing the find next free address operation.

According to another aspect of the embodiments, a method can include, in a find next free address operation, reading a single row of bit values of a highest hierarchy level, and prioritizing and encoding the bit values from the row of the highest hierarchy level to find a first index of a bit that has a free status.

According to another aspect of the embodiments, a method can include, in a find next free address operation, reading a row of bit values in the next lower hierarchy level according to the first index value, and prioritizing and encoding the bit values from the row of next lower hierarchy level to find a second index of a bit that has a free status.

According to another aspect of the embodiments, a method can include, in a find next free address operation, reading a row of bit values in the lowest hierarchy level according to an index value provided from a second lowest hierarchy level, prioritizing and encoding the bit values from the row of lowest hierarchy level to find a last index of a bit that has a free status. The method can then combine index values from all hierarchy levels to generate a next free address value.

DETAILED DESCRIPTION

Various embodiments of the present invention will now be described with reference to a number of diagrams. The embodiments show search engine systems and methods that can include a memory section, separate from any content addressable memory (CAM) array, which includes a free/not-free status bit for each CAM entry. In a learn operation, a series of storage locations within the memory can be accessed in a hierarchical fashion to prioritize status bits and arrive at a highest priority (next) free CAM entry address (NFA).

Status Memory Structure

Figure 1:
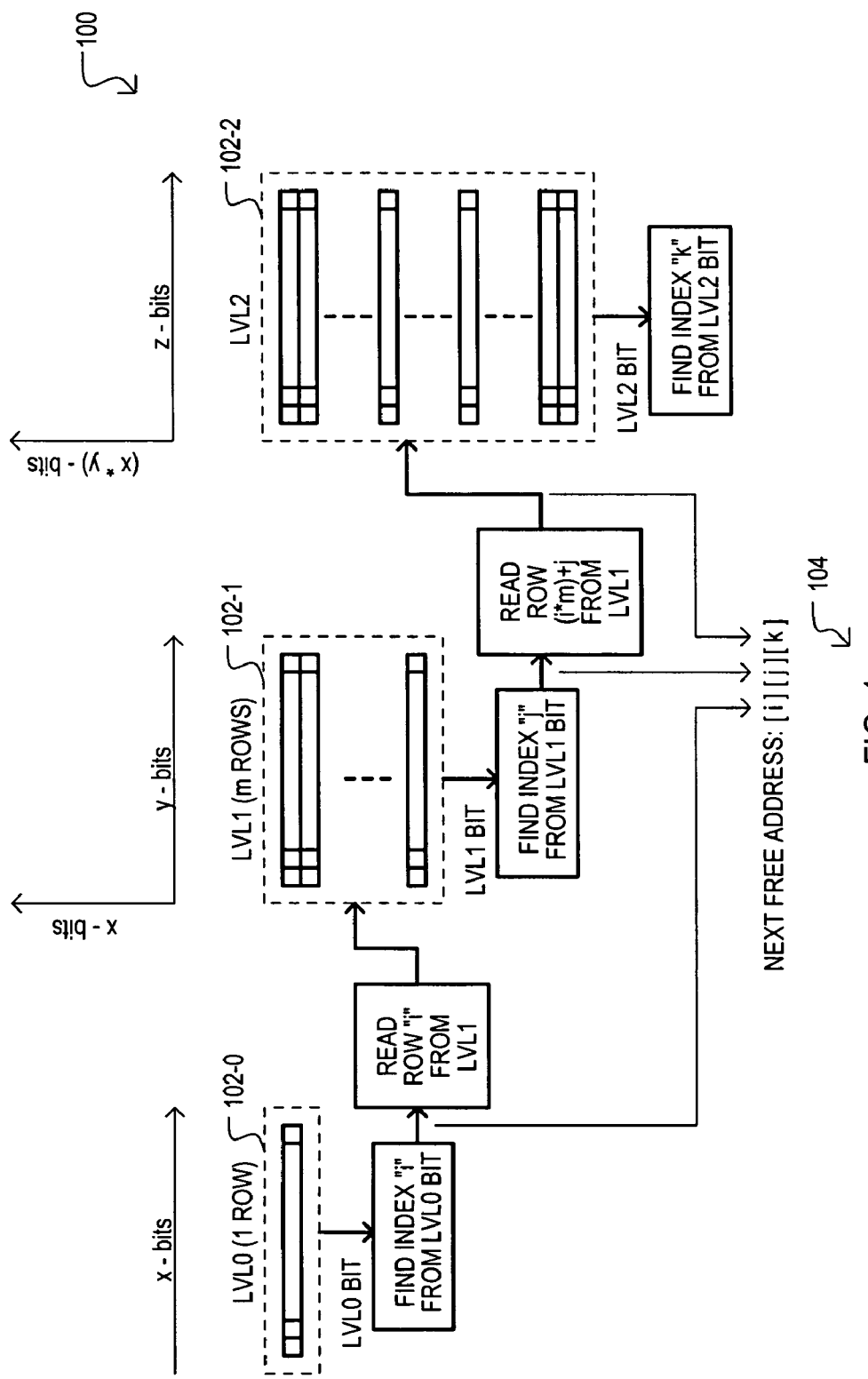
FIG. 1 is a block diagram of a status memory structure and a find next free address (NFA) function according to one embodiment.

An embodiment of a status memory structure that can be utilized to provide learn operations is shown in FIG. 1, and designated by the general reference character 100. A status memory structure 100 can include a number of sections organized in a hierarchical fashion, each of which can represent a status (i.e., free/not-free) for an increasingly larger number of CAM entries.

The particular example of FIG. 1 includes three sections 102-0 to 102-2. Section 102-0 can be considered highest in the hierarchy while section 102-2 can be considered lowest in the hierarchy. In a learn operation, each section (102-0 to 102-2) can be accessed in a hierarchical fashion to determine a next free address.

In a preferred embodiment, each section (102-0 to 102-2) can include random access memory (RAM) cells arranged into at least one row, preferably, static RAM cells. A last section 102-2 can include a number of bits that store status information for each CAM entry of a search engine device. Preferably, there can be a one-to-one relationship between the bits of a last section 102-2 and the CAM entries of a search engine. Further, a second (intermediate) section 102-1 can store status data for a group of bits in the last section (102-2). Preferably, each section preceding the lowest section can have one bit representing the status of a row of bits in the next lower section in the hierarchy.

In the very particular example of FIG. 1, section 102-2 can be a memory cell array having x*y rows, each of z bits. Section 102-1 can be a memory cell array having x rows of y bits, with each bit representing a row of z bits in section 102-2. Section 102-0 can be a row of x memory cells, with each bit representing a row of y bits in section 102-1.

The status memory structure 100 can support a learn operation by successive access to each section. In the event such memory structures are formed from SRAM cells, the address of a next free address can be rapidly accessed.

Instead of a CAM row bit, according the embodiment of FIG. 1, a LEARN operation can use a smaller storage structure (e.g., an SRAM bit) to thereby store the "free/used" state of a CAM entry. This can consume less area than the conventional approach, as CAM cells can be considerably larger than a typical SRAM cell.

A memory section is preferably implemented as a separate circuit block (referred as a "LEARN unit" or "status memory block"), and thus provide learn capabilities without necessarily requiring a modification to an existing CAM array design. This can result in considerable reduction in design and verification complexity as the learn unit can be more easily incorporated with a corresponding CAM array.

Having described a general status memory structure according to one embodiment, two basic functions will be described that can be included in various operations of a search engine device, including a "learn" operation or "unlearn" operation. The two basic functions include a "find next free address (NFA)" function and a "status update" function.

In the following examples, it will be assumed that a status memory block 100 provides a learn operation for a 20 M-bit TCAM with the three levels of hierarchy. The 20 M-bit TCAM can include 256K×80-bit entries. Consequently, there can be 256K status bits in a lowest level of the hierarchy, section 102-2. More particularly, a last section 102-2 can be organized as 4K×64-bits within an SRAM (i.e., x*y=4096, z=64). In the event the SRAM includes parity bits, such parity bits are not included in the hierarchy. This lowest level of the hierarchy can be considered a "leaf" level.

A next level in the hierarchy, section 102-1, can include 4K-bits of memory organized as 64×64-bits (i.e., x=64, y=64). At this level, each bit in the 4K-bits can "correspond" to one of the "rows" in the leaf section's 102-2 4K×64-bit memory. This level of the hierarchy can be considered an intermediate level.

At a root of the hierarchy, section 102-0, can be a 64-bit register or 64 bits of memory. Each bit in the register can "correspond" to a row of the 64×64-bit memory of the intermediate section 102-1. This level of the hierarchy can be considered an initial level, as a find NFA function can first access this level.

Accordingly, in the above arrangement each bit within leaf section 102-2 can correspond to one of 256K CAM rows (i.e., entries). Each bit within intermediate section 102-1 can correspond to 64 bits (i.e., one row) of leaf section 102-2, and thus represent a status of 64 CAM rows. Finally, each bit within root section 102-0 can correspond to 64 bits (i.e., one row) of intermediate section 102-1, and thus represent a status of 64×64 CAM rows.

In the above embodiment, all but the lowest hierarchy section can store "aggregate" status data. That is, each bit can represent a status of multiple bits. Preferably, such a status bit will have a "free" status, if any of bits in the corresponding lower hierarchy group has a "free" status. Conversely, such a status bit will have a "not-free" status, when all of the bits in the corresponding lower hierarchy group have a "not-free" status.

Accordingly, the present invention is readily distinguishable from conventional approaches, like those that include "shadow registers" storing a status of each CAM entry, as status data is organized in multiple level, hierarchical fashion. Further, the hierarchical arrangement of the disclosed embodiments can allow for establishment of "next-free" areas or blocks. That is, ranges of CAM entries can be designated as possible "next-free" addresses, while others may be excluded from such operations. This will be described in more detail below.

Find Next Free Address (NFA) Function

Figure 2:
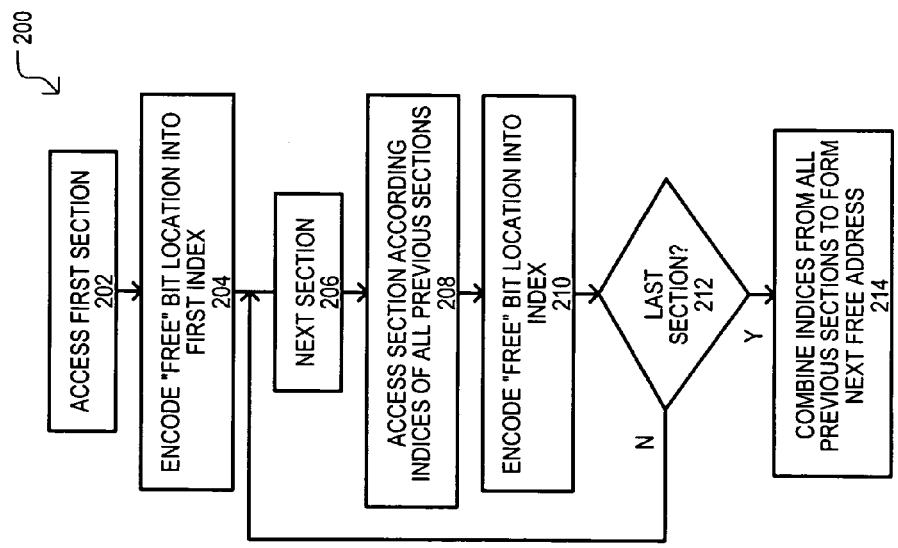
FIG. 2 is a flow diagram describing a find NFA function according to one embodiment.

A find NFA function will be described with reference to FIG. 1 in conjunction with FIG. 2. FIG. 2 is flow diagram describing particular steps of an NFA function.

According to one embodiment, a find NFA function can include accessing a first section (step 202). In the very particular example of FIG. 1, this can include accessing a 64-bit register or 64 bits of memory within section 102-0 to determine the status of bits stored therein.

A function 200 can then include encoding a free bit from the first section into a first index value (step 204). Such an operation can include selecting one free bit from among the free bits, and encoding the position of such a bit into an index value. In the very particular example of FIG. 1, this step can include encoding one of 64-bits into a 6-bit binary value "i".

In one very particular approach, the encoding of a free bit can be based on a priority established according to bit location.

A method can then proceed to a next section in the hierarchy (step 206). In the particular example of FIG. 2, this can include proceeding to intermediate section 102-1.

A find NFA function 200 can then access the current section according to the indices of all previous sections (step 208). In the very particular example of FIG. 1, this can include accessing one of 64 rows of section 102-1 with a 6-bit index (i) generated from section 102-0.

Find NFA function 200 can then include encoding a free bit from the accessed row into an index value (step 210). Such an operation can include selecting a free bit from among the free bits, and encoding the position of such a bit into an index value. In the very particular example of FIG. 1, this step can include encoding one of 64-bits of an accessed row into a second 6-bit binary value "j".

As in the case of the above first level described above, in one very particular approach, the encoding of a free bit can be based on a priority established according to bit location.

If a last section has been not been accessed, a method can proceed to a next section (steps 212 and 206), and then repeat steps 208 to 210. In the particular example of FIG. 1, this can include accessing one of 4K rows within last section 102-2 according to the two 6-bit index values generated from accessing both sections 102-0 and 102-1 (i and j). From the bits of the accessed row, a third 6-bit index value can be generated "k".

Once an index for a last section has been reached (step 212), indices from all previous sections can be combined to form a next free address (NFA) (step 214). In the particular example of FIG. 1, this can include combining three 6-bit index values to provide an 18-bit next free address (NFA) 104. More particularly, index "i" can form the six bits of highest significance, the index "j" can form the six bits of next significance, and the index "k" can form the six bits of least significance for an 18-bit NFA.

As will be described at a later point herein, a "find NFA" function be performed when a search engine device is first initialized to provide an initial NFA, and following the writing of CAM data in a learn operation, to thereby update an NFA. It may also be used during an "unlearn" operation that is used to designate entries as free or not free.

Status Update Function

Figure 4:
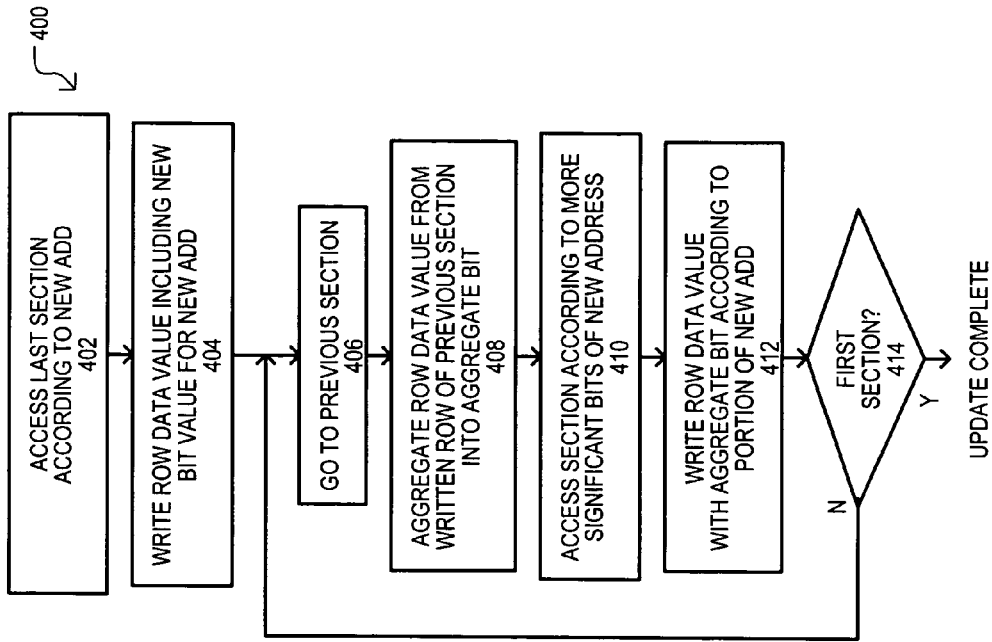
FIG. 4 is a flow diagram describing a status update function according to one embodiment.
Figure 3:
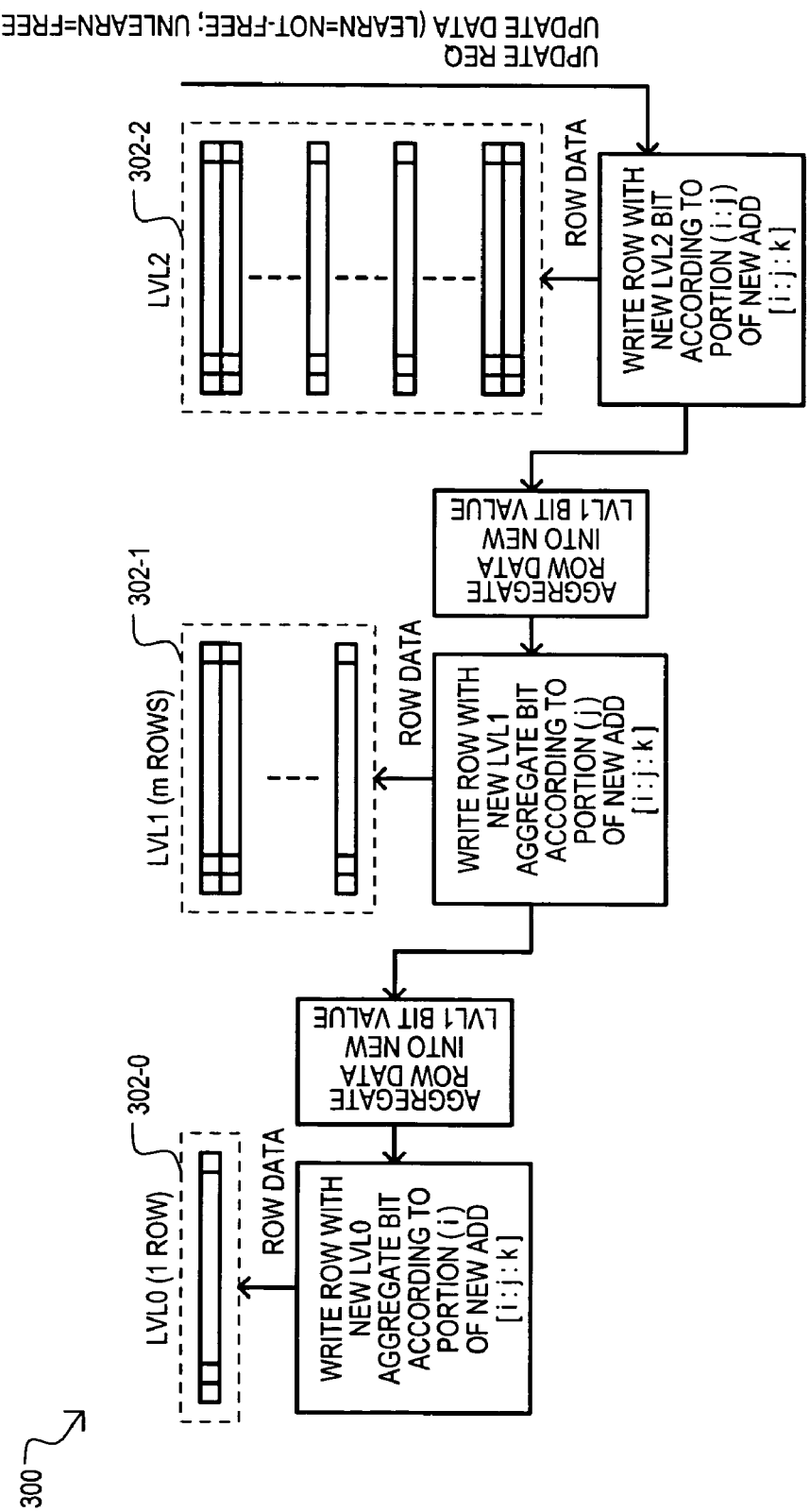
FIG. 3 is a block diagram of a status memory structure and a status update function according to one embodiment.

A status update function will now be described with reference to FIGS. 3 and 4. FIG. 3 is a block diagram showing the same general structure as FIG. 1, with like constituents being referred to by the same reference character, but with a first digit being a "3" instead of a "1". FIG. 4 is flow diagram describing particular steps of a status update function according to one embodiment.

A status update function according to one embodiment 400 can include accessing a last section according to a new address (step 402). In the very particular example of FIG. 3, this can include utilizing 12 most significant bits [i:j] of an eighteen bit new address [i:j:k] to access one 64-bit row within a last section 302-2. In a "learn" operation, a new address can be the NFA of a CAM entry to which data has been written. In an "unlearn" operation, a new address can be a CAM entry address for which the unlearn operation is to take place.

A status update function 400 can then include writing a row data value that includes a new bit value (step 404). In the very particular example of FIG. 4, this can include writing a 64-bit value that includes a new bit value determined according to the type of operation (i.e., learn or unlearn). The new bit value is altered at a location corresponding to the least 6 significant bits [k] of the new address [i:j:k]. Such a bit value can have a "not-free" value (e.g., a "0") in a learn operation. Such a bit value can have a "free" value (e.g., a "1") in an unlearn operation.

A status update function can then go to a previous section in the hierarchy (step 406). In the particular example of FIG. 4, this can include proceeding to intermediate section 302-1.

A status update function 400 can aggregate row data from a written row of a previous section (step 408). In one particular approach, such a step can include logically combining all bits of such a previous row to determine if any bits in the row have a "free" status. Thus, in the event a free status value is "1,", such a step can include a logical OR type operation. In the event a free status value is "0", such a step can include logically AND type operation.

A status update function 400 can further include accessing a current section according to a more significant bits of a new address (step 410). In the very particular example of FIG. 3, this can include utilizing 6 most significant bits [i] of an eighteen bit new address [i:j:k] to access one 64-bit row within intermediate section 302-1.

Row data can then be written that includes the new bit value generated by aggregating lower section bit values (step 412). In the very particular example of FIG. 3, this can include writing a 64 bit value with one bit altered, at a location corresponding to the middle 6 bits [j] of the new address [i:j:k].

If the last section written is not the first section of the hierarchy (step 414), steps 406 to 410 can be repeated with appropriate bits of higher significance to form aggregate bit values on higher hierarchical levels. If a first section has been reached, the update operation can be concluded (step 414).

It is noted that other types of operations within a CAM device can utilize a status update function. In particular, in certain write operations it may be desirable to update the free status of an entry when data is written into the entry.

Learn Area Operations—Block Copy

As noted above, unlike a conventional approach that may employ a "shadow register" for each CAM entry, a status memory structure according to the present invention can enable the defining of "learn areas" within a corresponding CAM array. A learn area can be portions of a CAM array in which next free addresses (NFA) can be generated. Thus, it follows that by operation of such an arrangement a search engine can include a CAM array having learn areas and "no-learn" areas.

It is understood that a learn area can support a specified width entry. That is, a learn area could include entries of width 80-bits or 160-bits or 320-bits etc. Such a learn area can be formed by presetting particular bit values in a hierarchical status memory block arrangement.

Figure 5:
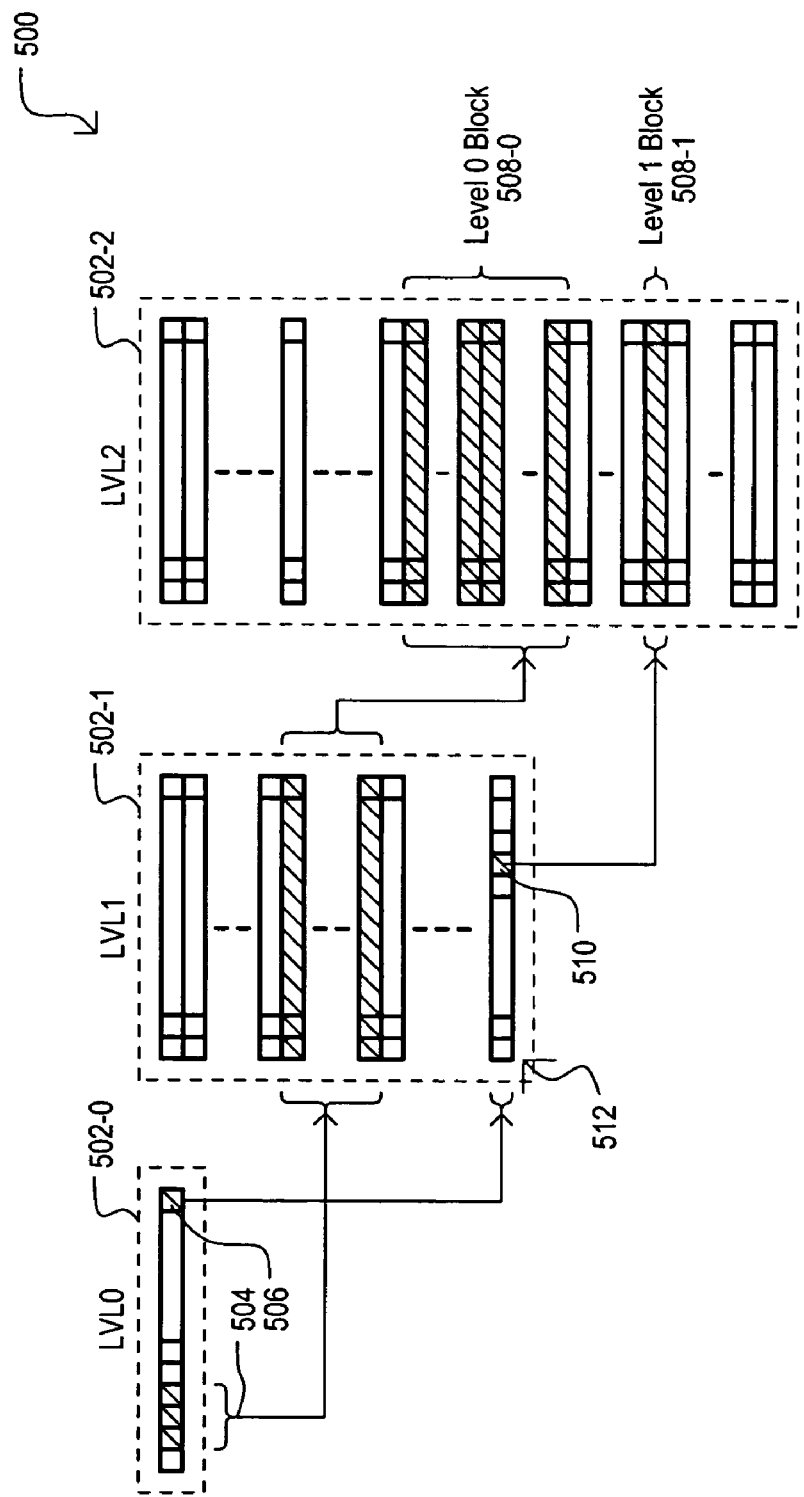
FIG. 5 is a block diagram of a status memory structure having "learn blocks" according to one embodiment.

A status memory block 500 that can provide learn/no-learn areas will now be described with reference to FIG. 5. FIG. 5 is a block diagram showing the same general structure as FIG. 1, with like constituents being referred to by the same reference character, but with a first digit being a "5" instead of a "1".

In the embodiment of FIG. 5, learn areas are delineated from no-learn areas by shading. As a result, a first section 502-0 can have a number of bits (shown shaded) that represent learn areas. Such bits can have a free value (e.g., "1"), while the other bits of first section 502-0 can have a not-free value (e.g., "0"). Arrows are provided to show how a free value at a higher hierarchical level corresponds to free values at all lower levels (again represented by shading).

Such an arrangement can be achieved by first setting all bits of a status memory block 500 to a not-free status. Then, free bit values can be selectively written to sections above a lowest hierarchy (502-0 and 502-1). Row data having "all free" bit values can be written into corresponding sections lower in the hierarchy, until free values are written into corresponding rows in a lowest hierarchy section 502-2.

The very particular example of FIG. 5 shows how learn blocks can be established on multiple hierarchical levels. In particular, a first section 502-0 is shown to include a collection of bits 504 marked free (shaded). Such free bits translate into free rows within section 502-1. Such free rows translate into a learn block 508-0 in last section 502-0.

However, FIG. 5 also shows a free bit written into first section 502-0 that corresponds to a free bit 510 written into memory section 502-1. That is, row 512 in memory section 502-1 is intentionally written to include some not-free bits. Free bit 510 translates into free row 508-1 in last section 502-2.

Of course, rows within last section 502-2 could be written to include some not-free bits as well. In such a case, corresponding higher hierarchy bits would be set to free.

In this way, learn blocks can be established at different levels of hierarchy, allowing flexibility (degrees of granularity) in establishing learn/no-learn areas.

Of course, a status memory block providing such a feature can be formed in the reverse fashion. That is, all bits can be pre-set to a free status, and selective portions written with "not-free" bit values.

Further, while learn/no-learn areas can be established by writing such values to status memory array/register structures, such values can be "hard-wired" into the device for "permanent" designation of learn/no-learn areas.

A status memory block, like that shown in the above embodiments, can be subject to a block copy function. Such a block copy function can be a conventional block copy operation on the lowest hierarchical level. However, in response to such a block copy, aggregation bits can be generated on each higher level of hierarchy as described above.

Physical Arrangement of Components

Figure 6:
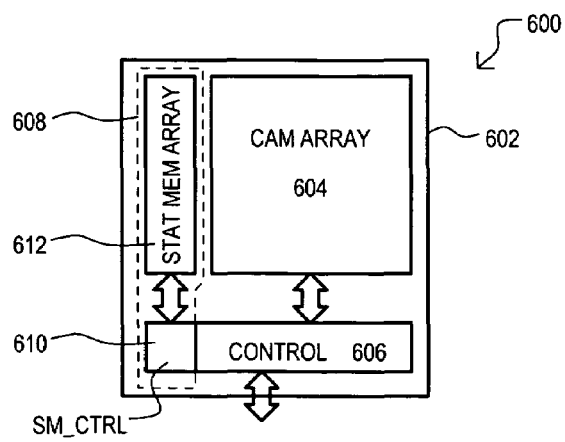
FIGS. 6 and 7A to 7C are block diagrams of search engine structures according to preferred and alternate embodiments.

A search engine device according to one embodiment of the present invention is set forth in FIG. 6 and designated by the general reference character 600. A search engine device 600 can preferably be formed on a single semiconductor substrate 602, and include a CAM array 604, a control section 606, and status memory block 608. A status memory block 608 can include a status memory control section 610 and status memory array 612. A status memory array 612 can include multiple sections of increasing hierarchy as described above. A status memory control section 610 can access a status memory array 612, and perform the various operations included in a find NFA and/or status update function.

FIG. 6 illustrates how a search engine device 600 may preferably include both a CAM array 604 and status memory block 608 formed on a single semiconductor substrate 602. Such an arrangement can provide an advantageously compact, "one-chip" search engine solution, presenting a small footprint with respect to a system board and fast operating speed.

While a one-chip solution may be preferable, the present invention should not necessarily be considered limited to such an arrangement. Various alternate embodiments are set forth in FIGS. 7A to 7C.

Figure 7A:
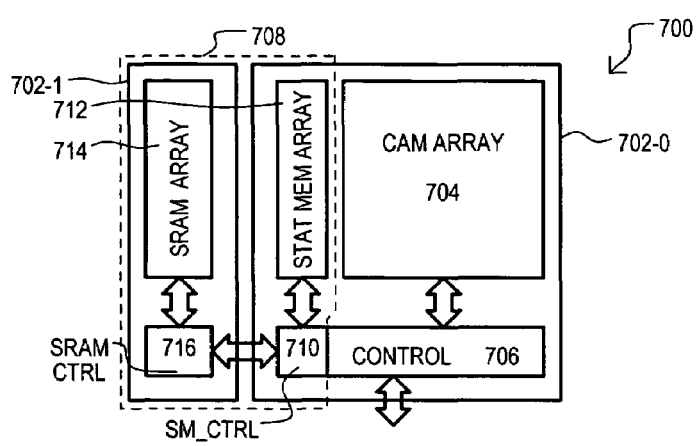

FIG. 7A includes some of the same general components as FIG. 6. However, unlike FIG. 6, a search engine device 700 can include two different integrated circuits 702-0 and 702-1. One integrated circuit 702-0 can include a CAM array 704, control section 706, status memory array 712, and a status memory control section 710. A status memory array 712 may not store all the status bits for CAM entries within CAM array 704. Instead, search engine 700 can also include a separate memory device formed in a separate substrate 702-1 for storing status data for CAM array 704. Such a separate memory device can include a memory control 716 and memory array 714.

In FIG. 7A substrate 702-1 can be a separate memory device, such as a conventional static random access memory, that is accessed by status memory control section 710. Thus, the memory device of substrate 702-1 can serve to store a portion of the status memory. Consequently, a status memory block 708 can be conceptualized as spanning two devices (i.e., chips).

Figures 7B, 7C:
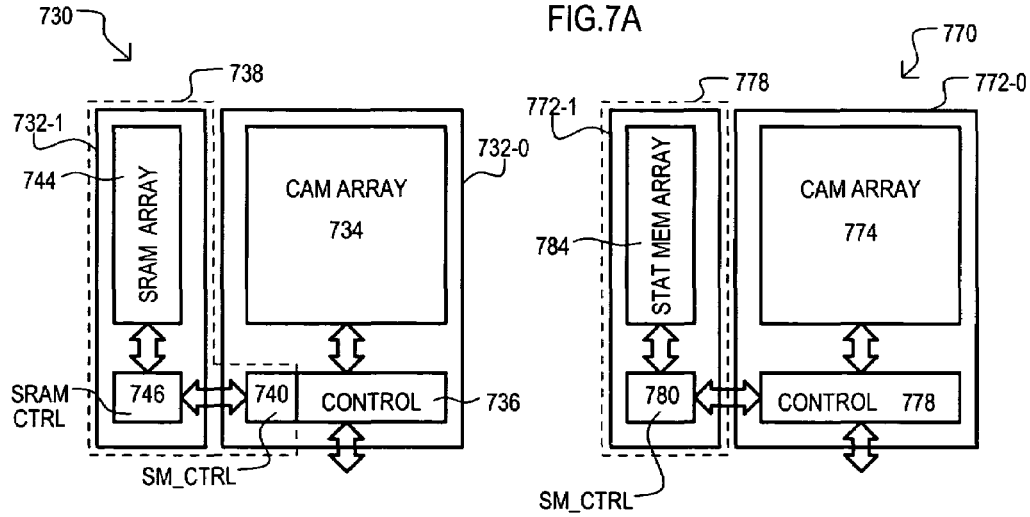

FIG. 7B shows an embodiment similar to that of FIG. 7A. However, in the embodiment 730 of FIG. 7B all status memory data can be stored on a separate memory device formed in substrate 732-1 separate from a substrate 732-0. Thus, a substrate 732-0 may include a status memory control section 740, but not include a status memory. In such an arrangement, status memory control section 740 can perform find NFA functions and status update functions via memory controller 746.

FIG. 7C shows an embodiment similar to that of FIG. 6. However, in the embodiment 770 of FIG. 7C a status memory block 778 can be formed as a separate integrated circuit. Thus, a first substrate 772-0 can contain a CAM array 774 and control section 778, while a second substrate 772-1 can contain a status memory array 784 and status memory control section 780. A status memory control section 780 can interface with control section 778 via an inter-chip connection.

Of course, the above alternate embodiments are but examples of possible embodiments, and the present invention should not be limited thereto.

Of course the above figures are intended to describe substrate boundaries and not a particular layout of circuit blocks.

Search Engine Device

Having described status memory structure, and various methods and functions associated with such a structure, a circuit block structure for status memory block will now be described. A status memory block according to one embodiment is set forth in FIG. 8 and designated by the general reference character 800. A status memory block 800 can include a status memory section 802 and a status memory control section 804.

Figure 8:
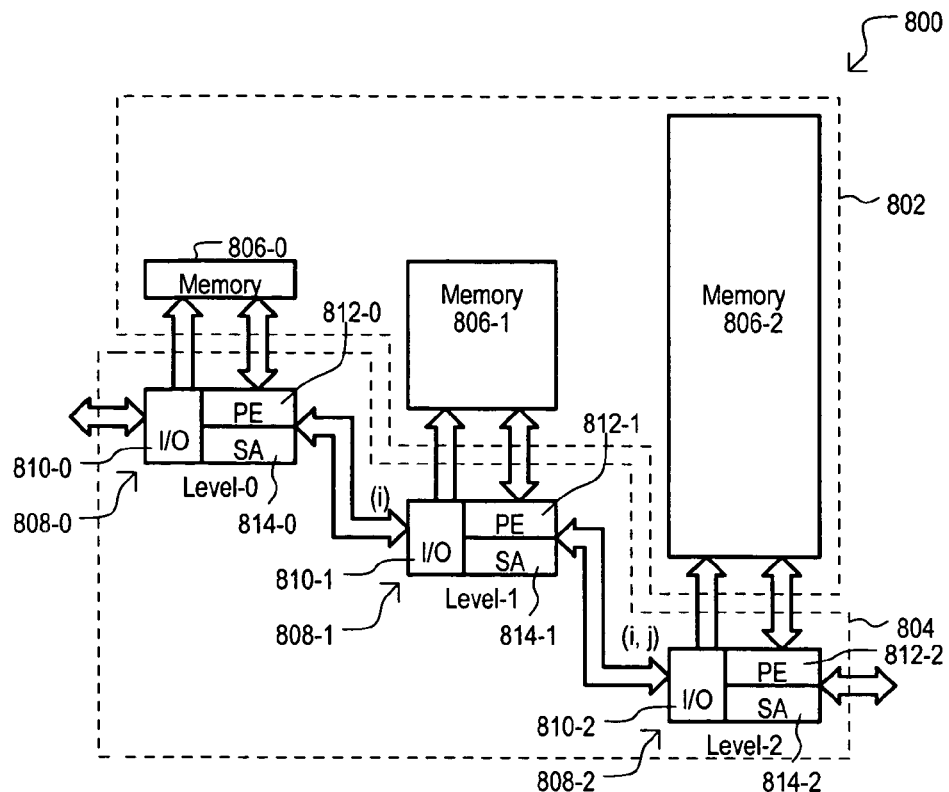
FIG. 8 is a block schematic diagram of a status memory block according to one embodiment of the present invention.

A status memory section 802 can include a hierarchical arrangement of memory sections, like those described with reference to FIGS. 1 and 3. Thus, a status memory section can include an initial section 806-0 highest in the hierarchy and a last (leaf) section 806-2 lowest in the hierarchy. Preferably, one or more intermediate sections can be included. The particular example of FIG. 8 shows one intermediate section 806-1.

A status memory control section 804 can include a control section corresponding to each memory section. Thus, FIG. 8 shows control sections 808-0 to 808-2 corresponding to memory sections 806-0 to 806-2, respectively. Each control section (808-0 to 808-2) can include an input/output (I/O) section (810-0 to 810-2), a priority encoder (812-0 to 812-2), and a status aggregator (814-0 to 814-2).

An I/O section (810-0 to 810-2) can control inputs and outputs to the corresponding control section (808-0 to 808-2) and memory sections (806-0 to 806-2). For example, a control section (808-0 to 808-2) can receive, and if desirable, forward command information, apply control and/or address signals to access locations in memory sections (806-0 to 806-2), and/or store or modify read or write data from such memory sections (806-0 to 806-2).

A priority encoder (812-0 to 812-2) can receive multiple data bits from a memory section (806-0 to 806-2), prioritize such bits, and encode the highest priority bit. Preferably, a priority encoder (806-0 to 806-2) can receive a data word read from a memory section, and process the bits of such a word in parallel. As but one very particular example, if data words are 64 bits wide, a priority encoder can prioritize and encode a highest priority bit value into a 6-bit index value. A highest priority bit can be based on bit location within a word. As but one example, in a 64-bit word having bit locations from [0] to [63], a lowest bit location would have the highest priority.

A status aggregator (814-0 to 814-2) can receive a multi-bit value, and generate a single bit based on aggregating such values. In particular, a status aggregator can receive a group of bits from a lower hierarchy memory section, and generate a "free" aggregate bit if any such bit of the group has a free status, and generate a "not-free" aggregate bit if all such bits have a "not-free" status. A status aggregate bit can be forwarded by an I/O section (810-0 to 810-2) of one control section, to the next higher control section in the hierarchy.

Having described the general composition of a memory status memory section according to one embodiment, the operation of such a section will now be described in more detail with reference to FIGS. 9A and 9B.

Figure 9A:
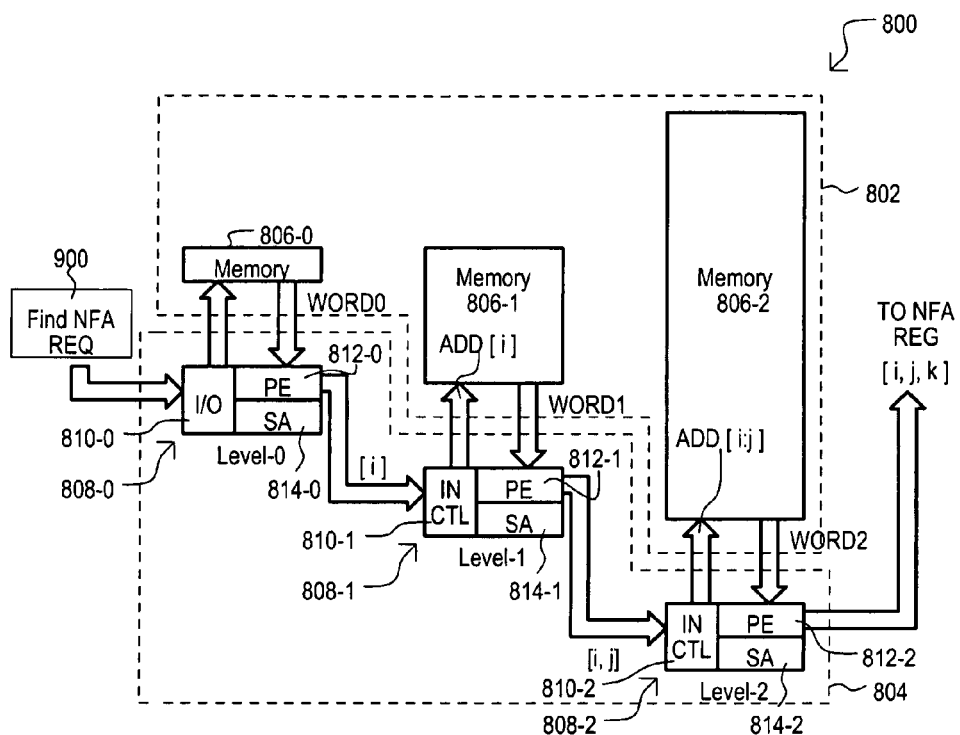
FIG. 9A is a block schematic diagram of a status memory block showing a find NFA function according to one embodiment.
Figure 9A:
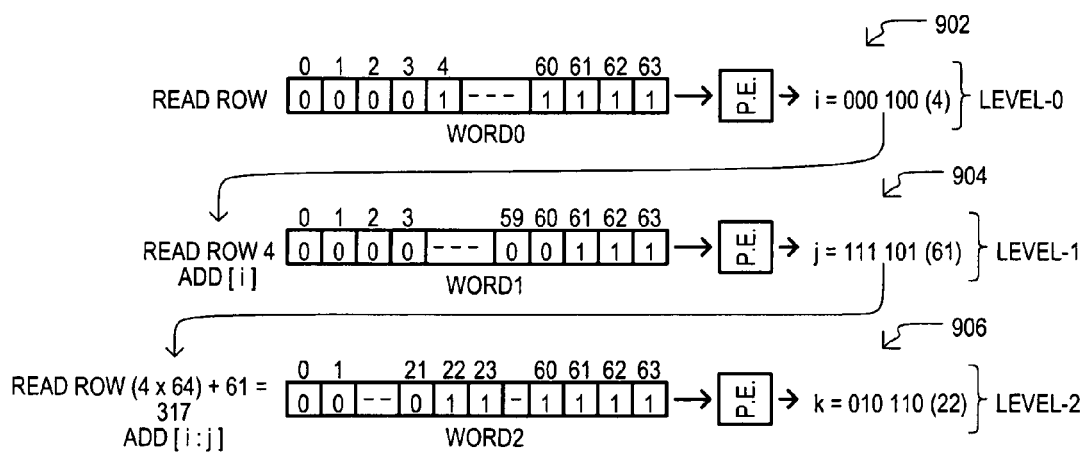
Figure 9B:
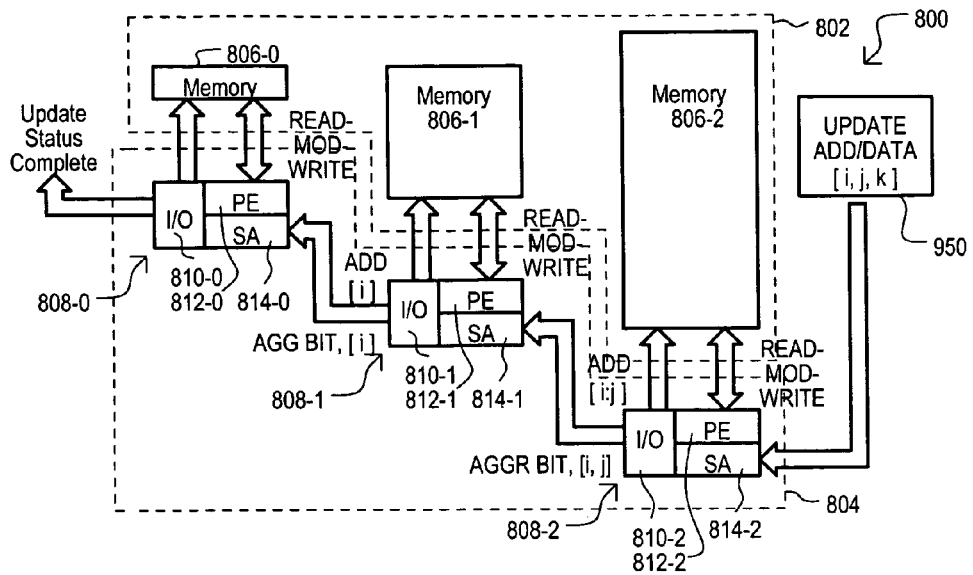
FIG. 9B is a block schematic diagram of a status memory block showing a status update function according to one embodiment.
Figure 9B:
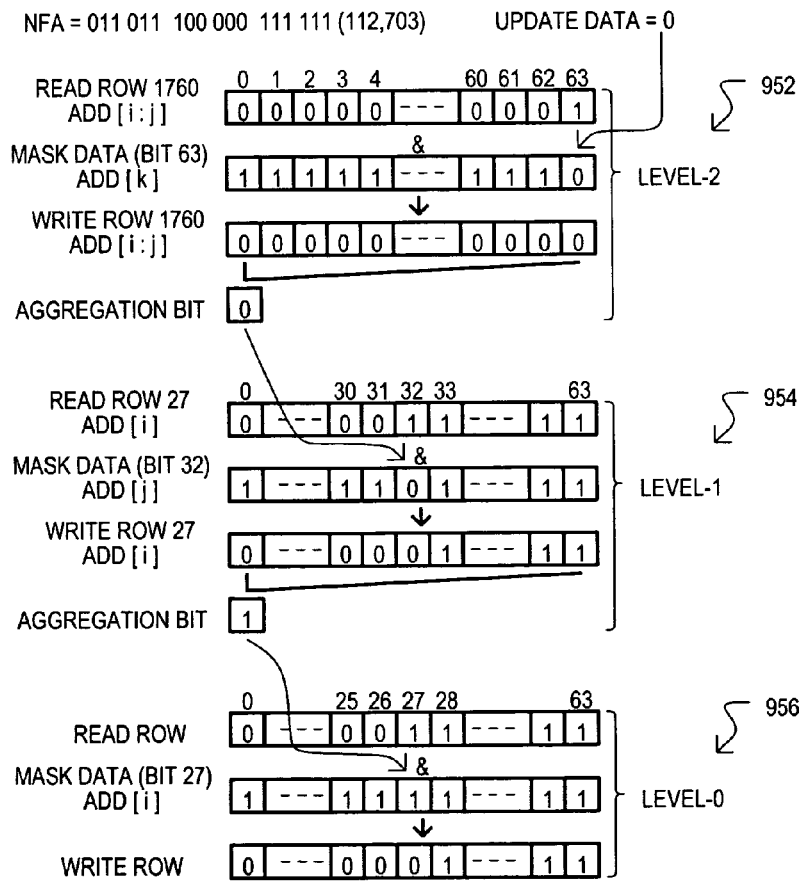

FIGS. 9A and 9B are block diagrams of the same circuit as FIG. 8, but with data flow indications showing a find NFA function and status update function, respectively. In the following description, it will be assumed that the various memory sections (806-0 to 806-2) have the particular bit width/depth of the previous example (1×64; 64×64; and 4k×64).

Referring now to FIG. 9A, in a find NFA function, a status memory block 800 can receive a find NFA request 900. As will be detailed later on, such a request may be generated in response to an applied command, or according to a given operation (e.g., initialization, learn operation, or unlearn operation).

A find NFA request 900 can be received by control section 808-0. The operation of control section 808-0 in response to such a request is shown by block flow 902. Memory section 806-0 can be read, and a resulting 64-bit row data (WORD0) can be output. The 64-bits of WORD0 can be prioritized and encoded. In the very particular example of 902, such prioritization can encode a lowest bit position having a free value (in this case "1") into a 6-bit index value "i". Thus, for the example shown, a "1" at bit location 4 results in i=000 100.

An index value [i] can be output from control section 808-0 to a next control section 808-1. In conjunction with index value [i], a control section 808-0 can also provide control signals to indicate a find NFA function.

In response to index [i] (and accompanying control signals, if present), memory section 806-1 can be read utilizing index [i] as an address. This can result in a 64-bit row data (WORD1) being output. As shown by block flow 904, the 64-bits of WORD1 can be prioritized and encoded in the same general manner as the previous control section 808-0 to form an index value j. In the very particular example of 904, a "1" at bit location 61 results in j=111 101. It is understood that while FIG. 9A appears to show a particular pattern (i.e., a bunch of 0s followed by a bunch of 1s), this need not be the case. Other configurations can include zeros between ones and vice versa according to the particular status data set.

All generated indices, in this example [i, j] can be output from control section 808-1 to a next control section 808-2, which is a last control section in this example. Again, control signals may also be provided to control section 808-2 that indicate a find NFA function.

In response to indices [i, j] (and accompanying control signals, if present), memory section 806-2 can be read utilizing indices [i, j] as an address. That is, bits of index i can form most significant bits of an address, while the bits of index j can form least significant bits. This can result in a 64-bit row data (WORD2) being output. As shown by block flow 906, the 64-bits of WORD2 can be prioritized and encoded in the same general manner as the previous control sections to form an index value k. In the very particular example of 906, a "1" at bit location 22 results in k=010 110.

All generated indices, in this example [i, j, k] can then output from control section 808-2 as a next free address (NFA). In the particular example of 9A, the NFA value is "000 1000 111 101 010 110". Such a value can then be stored in an NFA register.

Referring now to FIG. 9B, in a status update function, a status memory block 800 can receive a status update request, with an accompanying new address [i, j, k] and status data 950. Like a find NFA request, a status update request may be generated in response to an applied command, or according to a given operation (e.g., learn operation or unlearn operation). A new address [i, j, k] can be an 18 bit address, with i, j and k each being 6-bits. A value for status data can depend upon the type of operation. For example, in a learn operation, status data will be "not-free" (e.g., 0). However, in an unlearn operation, status data can be "free" (e.g., 1).

In response to a status update request, a last (lowest hierarchy) control section 808-2 can operate as shown in block flow 952. More particularly, memory section 806-2 can read utilizing more significant portions [i, j] of the new address, and a resulting 64-bit data value can be output. In the very particular example of 952, an NFA is [011 0111 100 000 111 111], thus row 1760 can be read. Such a read data value can be modified according to mask data according to a least significant portion [k] of the new address. Thus, in FIG. 9B, bit 63 is set to "0". A resulting modified data value can be written back into the read row. In addition, an aggregation bit can be generated from such a write data value. In the example of 952, because all bits of the modified write data value are not-free (0 in this example), an aggregation bit will be not-free (0).

Higher bits of new address [i, j] and a resulting aggregation bit (AGGR BIT) can be output from control section 808-2 to a control section 808-1 of next higher significance. A control section 808-2 can also provide control signals to indicate a status update function.

In response to address portions [i, j] and the aggregation bit (and control signals, if any), control section 808-1 can operate as shown in block flow 954. More particularly, memory section 806-1 can be read utilizing portion [i] of the new address, and a resulting 64-bit data value can be output. In the very particular example of 954, such a read value can be modified according to an aggregate bit value at a location corresponding to a least significant portion [j] of the new address. Thus, in FIG. 9B, bit 32 is set to "0". A resulting modified data value can be written back into the read row. In addition, an aggregation bit can be generated from such a write data value. In the example of 954, because a free bit (at least one bit 1) exists in the modified write data, an aggregation bit will be free (1).

Highest bits of new address [i] and a resulting aggregation bit can be output from control section 808-1 to a control section 808-0 of next higher significance (in this case the highest significance). A control section 808-1 can also provide control signals to indicate a status update function.

In response to address portions [i] and the aggregation bit (and control signals, if any), control section 808-0 can operate as shown in block flow 956. More particularly, memory section 806-0 can be read, and a resulting 64-bit data value can be output. In the very particular example of 956, such a read value can be modified according to an aggregate bit value at a bit location corresponding to a most significant portion [i] of the new address. Thus, in FIG. 9B, bit 27 is set to "1". A resulting modified data value can be written back into memory section 806-0.

Upon a successful writing of a modified data value back into a highest hierarchy memory section 806-0, an update status complete indication can be output from control section 808-0.

Of course, the above embodiment has described but one way of modifying stored data in a status update operation, and the particular read-modify-write operation and bit masking arrangement should not be construed as limiting the invention thereto. An equivalent operation could be accomplished with a write-read operation. In particular, a modified data bit can be written (via bit masking or the like), and the resulting value read back to determine an aggregation bit value.

It is understood that in an unlearn operation, a status update function is essentially the same, but with an initial bit value being written into lowest hierarchy section (e.g., 802-2) being a "free" value, instead of a "not-free" value.

Still further, while the above embodiment has shown a control section corresponding to each memory section, alternate embodiments could include a single control section multiplexed among multiple memory sections.

Figure 10:
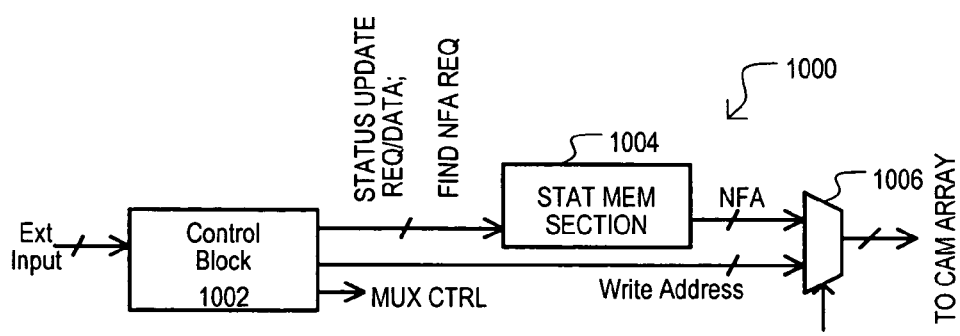
FIG. 10 is a block schematic diagram showing a search engine address multiplexer according to one embodiment of the present invention.

In addition to a memory block section, a search engine device can include an address multiplexing (MUXing) section, like that shown in FIG. 10. An address MUXing section 1000 can include a control block 1002, a status memory block 1004, and an address MUX 1006. A control block 1002 can receive external input signals such as address, data and command values. Such a block can decode command to generate requests, including but not limited to, a status update request or find NFA request, as noted above. Further according to such commands, control block 1002 can generate control signals (MUX CTRL) for address MUX 1006.

In the event of a write operation, a control block 1002 can output a write address to one input of address MUX 1006.

A status memory block 1004 can take the form of the various embodiments shown above. Thus, in response to a find NFA request, a status memory block 1004 can generate an NFA. Such an NFA can be output to another input of address MUX 1006.

Address MUX 1006 can selectively output one of the received addresses to a CAM array.

In this way, an address MUXing section 1000 can selectively output either a received address value or NFA depending upon the particular command to be executed.

Search Engine Method

Having described one particular example of a search engine system, a search engine method will now be described with reference to FIG. 11.

Figure 11:
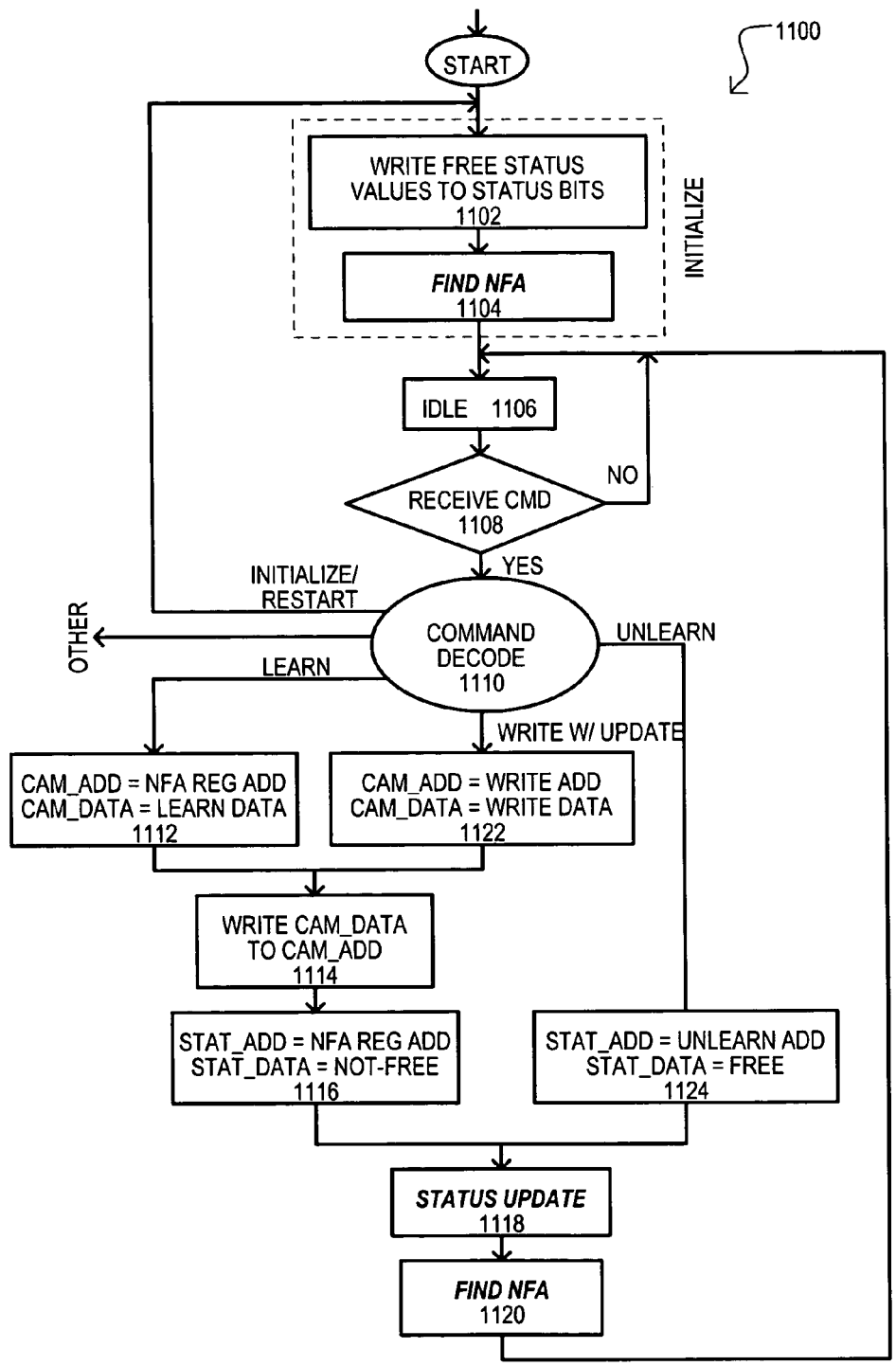
FIG. 11 is a flow diagram showing a search engine operation according to one embodiment.

FIG. 11 is a flow diagram showing a search engine method that can execute a number of operations including, but not limited to, an initialization operation, a learn operation, and an unlearn operation. Such operations can include both a status update function and/or a find NFA function as described above.

A method 1100 can include, upon start-up or reset, an initialization operation. In the particular example shown, an initialization operation can include writing "free" status values to status bits (step 1102). Such a step can include writing a particular bit value (e.g., "1") to all bit locations, if an entire status memory can be utilized for NFA operations. However, if "learn" areas are desired, such a step can include writing "not-free" values (e.g., "0") to bit locations at higher hierarchical levels, to thereby exclude corresponding status bits from learn operations. Such an initial status memory writing operation can be followed by a find NFA function (step 1104). Thus, following initialization an NFA address will be readily available, without requiring a "search-miss" be performed, as can occur in conventional approaches.

Once initialization is performed, a search engine method 1100 can go to an idle state (step 1106) and wait for commands. Upon reception of a command (step 1108) a method can proceed to decode the command (step 1110).

It is understood that a decode command step (step 1110) can involve the decoding of numerous possible operations provided by a search engine device. Thus, a branch (OTHER) is provided to indicate such other commands (e.g., search, read, etc.). Such other commands will not be discussed herein, but are well understood by those skilled in the art.

In a restart or initialize operation, a search engine can return to the initialization steps described above.

In a learn operation, a search engine can set a CAM address to the current NFA residing in an NFA register, and set CAM data to "learn data" provided (step 1112). This step emphasizes that a search-miss is not required for a learn operation. Learn data can typically include a search key, or some portion thereof provided from a source external to the search engine. The learn operation can then write the learn data to the CAM address (i.e., the NFA) (step 1114).

A learn operation can then set a status address value to the same NFA value to which data has just been written. In addition, a status data value can be set to "not-free" (step 1116). Such a step can include simply providing an NFA to a status memory block with some indication of an NFA operation, as described above. A learn operation may then execute a status update function (step 1118), as described above. Such a step can result in the status bit corresponding to the NFA being changed from "free" to "not free", and any higher hierarchical bits being changed, as needed.

A learn operation can conclude with a find NFA function (step 1120) as described above. In this way, the old NFA resident within the NFA register will be replaced by a new NFA.

Figure 12:
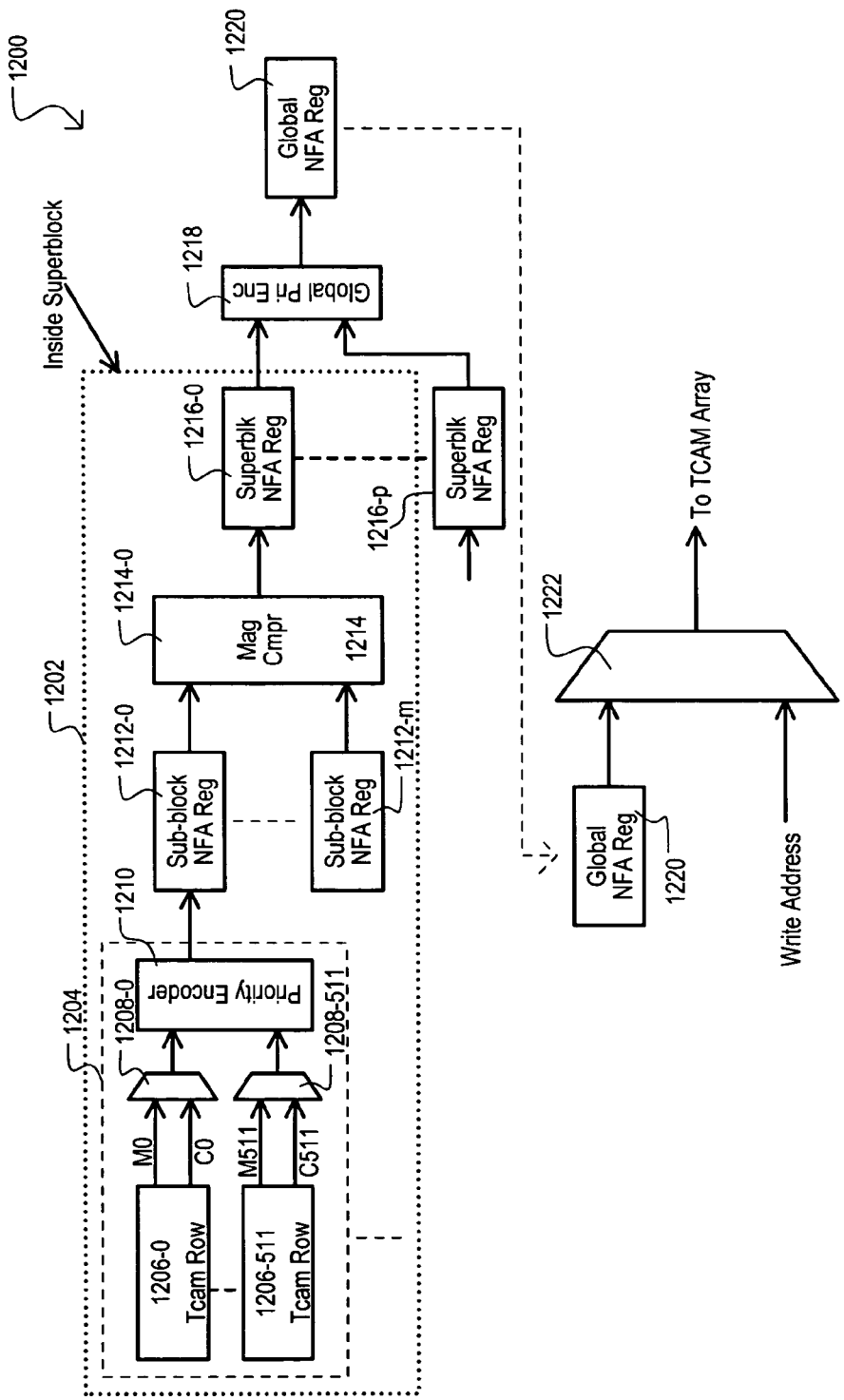
FIG. 12 is a block schematic diagram of a conventional content addressable memory (CAM) device having a learn operation capability.

In a write with update operation, a search engine can set a CAM address to an externally provided write address. In addition, a CAM data value can be set to externally provided write data (step 1122). As understood from FIG. 12, a write with update operation can then proceed in the same general fashion as a learn operation (steps 1114 to 1120).

It is understood that a write with update operation described above represents but one of many possible write operations. It is understood that a search engine may have other write operations that do not update status data.

In an unlearn operation, a search engine can set a status address value to a provided "unlearn address". In addition, a status data value can be set to a "free" status (step 1124). Again, such a step can include simply providing an unlearn address to a status memory block with some unlearn indication, as described above. A learn operation may then execute the status update function (step 1118) and find NFA function (step 1120). Such a step can result in the status bit corresponding to the unlearn address being changed from a value to a "free" value, and any higher hierarchical bits being changed, as needed.

In the various embodiments described above, in a learn (or unlearn) operation, each find NFA function can involve two memory reads (one for an intermediate memory section and one from a last memory section), three priority encoding operations (one for each of three memory sections), and two write operations (one for an intermediate memory section and one from a last memory section). In one particular embodiment, the two write operations can be performed in the same cycle.

In addition, in a preferred embodiment, when a memory section is formed from a RAM array, such a memory section can be parity-protected or ecc-protected.

Still further, the various embodiments have described examples in which at least one status bit has a "free" status following each operation. It is understood that when no free entries are available, a search engine can return an error or failure result.

While the various embodiments have shown architectures having three levels of hierarchy, one skilled in the art would recognize that other embodiments could include more hierarchical levels.

Still further, while the embodiments of FIGS. 8, 9A and 9B show priority encoders for encoding a free status bit position, the present invention should not be construed as being limited to such an arrangement. A winning (e.g., selected status bit position) could be determined with other types of logic circuits and/or based on other criteria.

Along these same lines, while particular memory sections examples have been described as being composed of particular data storage circuit types (e.g., RAM or SRAM), the present invention should not be construed as being limited to such an arrangement. Status data of any hierarchy level could be stored in full or in part, within various alternate storage circuit types. As but a few examples, such circuits can include dynamic RAM (DRAM) circuits, registers, or even non-volatile memory types, to name but a few of the many possible examples.

The various embodiments can have advantages over conventional search engine devices. First, learn operations can be executed with a high throughput. That is, while addressing/accessing multiple memory sections may require multiple clock cycles (higher latency), access to such memory sections can be faster than access to CAM arrays, particularly, if a search-miss is required. In addition, such a feature can be provided with lower area overhead by using smaller storage circuits, such as SRAM bits instead of CAM bits to store status data. Further, extra logic needed to search and update such status bits can be formed without having to import extra logic inside and existing CAM architecture (e.g., a TCAM superblock).

Further advantages can include reduced chip design and verification complexity as status data and corresponding circuits can be designed as separate blocks without interfering with the rest of a CAM device. In addition, a search engine according to the embodiments can support more applications, as there is no longer a dependence on search-miss to generate an NFA. Further, a device can support multiple LEARN areas, and multiple LEARN widths by using the same base implementation.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

Accordingly, it is understood that while the various aspects of the particular embodiment set forth herein has been described in detail, the present invention could be subject to various changes, substitutions, and alterations without departing from the spirit and scope of the invention.

What is claimed is:

1. A search engine device, comprising:
   a content addressable memory (CAM) cell array arranged into a plurality of CAM entries that each store data values for comparison with search key values; and
   a status memory block separate from the CAM cell array that includes
      a leaf section having a plurality of rows that each include a plurality of bits, each such bit representing the free/not-free status of one CAM entry, and
      an intermediate section having a plurality of rows that each includes a plurality of intermediate bits, each such intermediate bit indicating whether all of the CAM entries of a corresponding leaf section row have a not-free status or at least one CAM entry of the corresponding leaf section row has a free status.

2. The search engine device of claim 1, wherein:
   the status memory block comprises an array of static random access memory (SRAM) cells.

3. The search engine device of claim 1, further including:
   at least one priority encoder for receiving and encoding a highest priority bit from a selected row of the leaf section into an index value.

4. The search engine device of claim 3, wherein:
   the status memory block further includes
   a next free address register that stores the address of an available CAM entry available having a free status, at least a portion of the address of the available CAM entry being generated by the at least one priority encoder.

5. The search engine device of claim 1, further including:
   an input control section for receiving at least a write address in a write operation; and
   an address multiplexer having a first input coupled to the status memory block for receiving at least a next free address value, a second input coupled the input control section for receiving at least a write address, and an output coupled to the CAM cell array.

6. The search engine device of claim 1, wherein:
the status memory block includes
the leaf section having x*y*z bits, each such bit storing a free/not-free status of one CAM entry,
an initial search section of x bits, each such bit representing a write status for a different set of y*z CAM entries, and
a priority encoder for encoding a highest priority bit from the x bits.

7. The search engine device of claim 1, wherein:
the status memory block further includes
a priority encoder for receiving and encoding a highest priority bit from a selected row of the intermediate section.

8. The search engine device of claim 1, wherein:
the status memory block includes
the leaf section having x*y*z bit storage locations, each of which indicates the free/not-free status of a CAM entry,
an intermediate section having x*y bit storage locations, each corresponding to a different z bits of the leaf section and indicating if any one of the corresponding z bits has a free status, and
an initial search section having x bit storage locations, each corresponding to a different y*z bits of the leaf section and indicating if any one of the corresponding y*z bits has a free status.

9. The search engine device of claim 8, further including:
a next free address register that stores the address of an available CAM entry available for a learn operation, said available CAM entry address being a combination of binary values i, j and k, where i is an encoded value in the range of 0 to x−1, j is an encoded value in the range of 0 to y−1, and k is an encoded value from 0 to z−1.

10. An apparatus that includes a content addressable memory (CAM) for performing a learn operation, comprising:
a circuit block external to and independent from any CAM array of the apparatus, the circuit block comprising a plurality of sub-blocks;
each sub-block including a plurality of memory elements storing a free/not-free status for at least one entry of the CAM array; and
each sub-block includes a corresponding selection circuit for encoding the location of one bit from a plurality of bits provided by memory elements of the corresponding sub-block; wherein
the sub-blocks have a hierarchy with respect to one another, and
the memory elements of each sub-block store the free/not-free status of a larger number of entries of the CAM array than the memory elements of sub-blocks that are lower in the hierarchy.

11. The apparatus of claim 10, wherein:
a lowest sub-block of the hierarchy has memory elements that each store the free/not-free status of one entry of the CAM array.

12. The apparatus of claim 11, wherein:
each sub-block except the lowest hierarchy sub-block includes
memory elements that each store the status of an aggregation of memory element values of the next lower sub-block in the hierarchy, and
status aggregation logic that logically combines multiple memory element values of the next lower sub-block in the hierarchy to form an aggregated status value.

13. A method for tracking a free/not-free status of entries in search engine device, where such entries are compared to a search key, the method comprising the steps of:
storing free/not-free status data for each entry in a status memory that is a physically separate circuit block from the entries;
storing a free/not-free status of each entry as one bit in a lowest hierarchy level;
storing aggregation bits in at least one higher hierarchy level, each aggregation bit representing the free/not-free status for different groups of bits in the lowest hierarchy level; and
determining at least a portion of next free address by prioritizing and encoding selected bits from the lowest hierarchy level and prioritizing and encoding selected bits from the at least one higher hierarchy level.

14. The method of claim 13, wherein:
in a find next free address operation
prioritizing aggregation bits of the at least one higher hierarchy level to determine a group of bits in the lowest hierarchy level that includes at least one bit having a free status, and encoding a storage location including such an aggregation bit to form a first part of a next free address;
prioritizing the group of bits in the lowest hierarchy level to determine a bit corresponding to a highest priority entry having a free status, and encoding a storage location including such a bit to form a second part of the next free address; and
storing the next free address in a next free address register.

15. The method of claim 14, wherein:
each entry of the search engine has a unique address and each bit of the lowest hierarchy level corresponds to a unique address; and
in a learn operation
writing learn data to an entry corresponding to a learn address,
setting the status of the bit in the lowest hierarchy level corresponding to the learn address to not-free,
updating the status of all aggregation bits corresponding to the updated bit in the lowest hierarchy level; and
performing the find next free address operation.

16. The method of claim 14, wherein:
in an initialization operation,
setting all bits in all hierarchy levels to a free status, and
performing a find next free address operation.

17. The method of claim 16, wherein:
the find next free address operation further includes
reading a single row of bit values of a highest hierarchy level, and
prioritizing and encoding the bit values from the row of the highest hierarchy level to generate one portion of a next free address.

18. The method of claim 17, wherein:
the find next free address operation further includes
reading a row of bit values in the next lower hierarchy level according to the first index value, and
prioritizing and encoding the bit values from the row of next lower hierarchy level to find a second portion of the next free address.

19. The method of claim 17, wherein:

the find next free address operation further includes reading a row of bit values in the lowest hierarchy level according to an index value provided from a second lowest hierarchy level, prioritizing and encoding the bit values from the row of lowest hierarchy level to find a last index of a bit that has a free status, combining address portions all hierarchy levels to generate the next free address value.

20. The method of claim 14, wherein:

each entry of the search engine has a unique address and each bit of the lowest hierarchy level corresponds to a unique address; and in an unlearn operation setting the status of the bit in the lowest hierarchy level corresponding to an unlearn address to free, updating the status of all aggregation bits corresponding to the updated bit in the lowest hierarchy level; and performing the find next free address operation.

\* \* \* \* \*